United States Patent [19]

Nakano et al.

[11] Patent Number: 5,068,619
[45] Date of Patent: Nov. 26, 1991

[54] CONDUCTIVITY MEASURING DEVICE

[75] Inventors: Shohkichi Nakano, Kawasaki; Akira Matsushita, 12-5, Miyazaki 1-Chome, Miyamae-Ku, Kawasaki-Shi, Kanagawa-Ken, both of Japan

[73] Assignees: Nihon System Research Institute Inc.; Akira Matsushita, both of Kawasaki, Japan

[21] Appl. No.: 261,871

[22] Filed: Oct. 25, 1988

[30] Foreign Application Priority Data

Oct. 27, 1987 [JP] Japan .................. 62-271351

[51] Int. Cl.⁵ ........................................... G01R 27/02
[52] U.S. Cl. ................................. 324/715; 324/692; 324/358
[58] Field of Search .................. 324/65 P, 65 R, 354, 324/357, 358, 365

[56] References Cited

U.S. PATENT DOCUMENTS

| | | | |
|---|---|---|---|
| 2,190,321 | 2/1940 | Potapenko | 324/362 |
| 2,345,608 | 4/1944 | Lee | 324/358 |
| 3,319,158 | 5/1967 | McDoulett | 324/357 |
| 3,382,428 | 5/1968 | Sherwood | 324/357 |
| 4,041,372 | 8/1977 | Miller | 324/357 |
| 4,446,424 | 5/1984 | Chatanier | 324/65 P |
| 4,467,283 | 8/1984 | Owen | 324/357 |
| 4,546,310 | 10/1985 | Chatanier | 324/65 P |
| 4,553,087 | 11/1985 | Kuhn | 324/65 P |

Primary Examiner—Kenneth A. Wieder
Assistant Examiner—Jose M. Solis
Attorney, Agent, or Firm—Beveridge, DeGrandi & Weilacher

[57] ABSTRACT

A conductivity measuring device comprises a low-potential intermediate electrode which is capable of being in connected state by a switch and which is disposed between a couple of measuring electrodes for transmitting and receiving. Each of said electrodes is made contact with a body to be tested so that the conductivities of the surface and the inner portion of said body to be tested can be measured, respectively.

8 Claims, 1 Drawing Sheet

CONDUCTIVITY MEASURING DEVICE

BACKGROUND OF THE INVENTION

1. Field of the Invention

This invention relates to a conductivity measuring device, and more particularly relates to a conductivity measuring device for measuring the conductivities of the surface and the inner portion of a body to be tested separately.

2. Description of the Prior Art

In order to measure the conductivity of a substance, such as the skin of a living body, which has a high electric specific resistance, and moreover has different conductivities for the surface layer and the deep portion thereof, a method has been utilized in which a couple of electrodes are contacted on the surface of a substance to measure conductivity between the electrodes. In such a conventional measuring method, however, it is difficult to measure the conductivities of the surface and the inner portion of a body separately.

When grounding resistance or the like is measured, Kohlrausch method, Wiechert method and the like are being tried, and the potentiometric grounding resistance meter, the constant current-type grounding resistance meter and the like are being utilized.

There are difficulties, however, in utilizing these methods for measuring conductivities each of which is different for the surface and the inner portion of a body to be tested, such as a living body or the like according to water content, blood or the like.

For a substance which has a high conductivity, such as a metal, it is possible to measure the conductivities of the surface and the inner portion separately to some extent by skin effect due to high-frequency wave. For a substance which has a low conductivity, however, such a method has only a small effect, and moreover, the frequency for obtaining the effect becomes very high. Hence, it cannot be put in practical use.

It will be noted that there is the following opinion. That is, cell membranes of subcutaneous cells of the skin of a living body have a very large electrostatic capacity (about 1 $\mu$F/cm) and so they can be considered as insulators. Hence, when the frequency of an applied power supply is low, only physiological liquid between cells contributes to the conductivity. When the frequency becomes high, however, current flows even in intercellular liquid through cell membranes (see, for example, Yutaka Kanai, "Basis of impedance measurement and its application to clinical practice," Journal of clinical inspection, pp. 421–429, vol.26, No. 4, 1982-4).

Accordingly, it is said that, as for applied voltage between electrodes, it is effective to use that of low frequency for measuring surface current, while to use that of high frequency for measuring current in a deep portion which reaches subcutaneous cell membranes having large electrostatic capacities.

An actual skin shows, however, a considerably complicated pattern of conductivity from the surface to the inner portion, and electrical properties of each portion of a living body change every moment. Hence, it is difficult to generally simulate the skin by a simple model or an equivalent circuit.

Consequently, in the method of measuring conductivity from the surface of a skin by contacting electrodes thereto, it has hitherto been considered that it is extremely difficult to detect the conductivities of the surface and the inner portion separately.

SUMMARY OF THE INVENTION

It is an object of the present invention to provide a simple measuring device capable of detecting conductivities of the surface and the inner portion of a body to be tested, such as a living body, which differ from each other according to water content or the like, respectively, by means of contacting specified electrodes to the body to be tested, and subsequently operating.

A conductivity measuring device of the present invention has a characteristic in that a low-potential intermediate electrode capable of being in connected state by a switch is disposed between a couple of measuring electrodes for transmitting and receiving, and each of the electrodes are contacted with a body to be tested so that the conductivities of the surface and the inner portion of the body to be tested can be measured, respectively.

On this occasion, each of the measuring electrodes for transmitting and receiving and the intermediate electrode may also be concentrically disposed, and these electrodes may be unified into a probe. The internal current of a body to be tested is measured by disposing the intermediate electrode between the measuring electrodes for transmitting and receiving, and subsequently the surface current is measured by making said intermediate electrode in open state by the switch, and the both measured values are operated so that the conductivity of the surface of said body to be tested can be exactly determined.

The device of the present invention can also be so constituted that an FM transmitter and a power supply battery are loaded in said probe whereby the measured results can be determined by an FM receiver.

The present invention has further characteristics such that the frequency of a power supply when the conductivity of the inner portion of a body to be tested is measured is set higher than that when the conductivity of the surface is measured, or each of said electrodes consists of a conductive soft material so as to contact the surface of a body to be tested in accordance with the shape of the surface or a body to be tested.

DESCRIPTION OF THE PREFERRED EMBODIMENT

Figure 1:
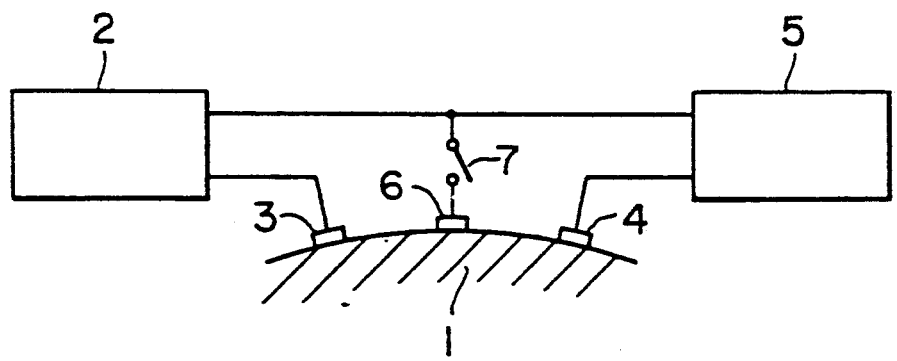
FIG. 1 is a configurational diagram of the principle showing an embodiment of the present invention.

FIG. 1 shows a configurational example of the principle of a conductivity measuring device of the present invention. The device comprises a transmitting unit 2 for transmitting a frequency which fits properties of a body 1 to be tested, a transmitting electrode 3 for applying the transmitted output, a receiving electrode 4 for capturing the transmitted output which has passed the body 1 to be tested, a receiving unit 5 connected thereto, an intermediate electrode 6 set to a low potential or grounded potential which is situated between the transmitting electrode 3 and the receiving electrode 4 and a switch 7. On this occasion, an operational circuit for processing measured results of conductivity and a display circuit are equipped in the receiving unit 5.

Figure 2:
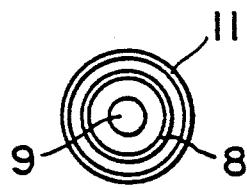
FIGS. 2 and 3 are examples of dispositions of each electrode.

FIG. 2 illustrates a conventionally-utilized disposition of electrodes for surface measurement in which each of electrodes make contact with a body to be tested, the electrodes being concentrically disposed. A circular electrode in the center is a receiving electrode 9, an annular electrode on the outer circumference thereof is a transmitting electrode 8, and on the utmost outer portion there is a guard ring 11 for preventing induction which is generally used with being grounded.

Figure 3:
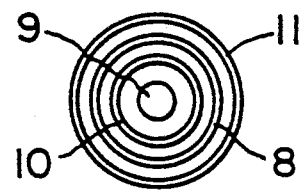

On the contrary, FIG. 3 is a configurational example of each of concentrically-disposed electrodes used in the present invention, in which an intermediate electrode 10 is disposed between the receiving electrode 9 and the transmitting electrode 8.

Figure 4:
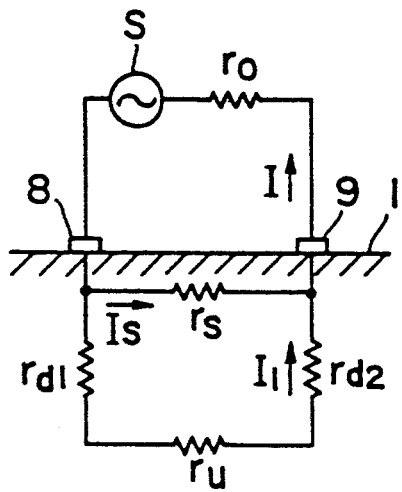
FIGS. 4 and 5 show equivalent circuits of models in the case where the electrodes disposed as shown in FIGS. 2 and 3 are made contact with an body to be detected, respectively.

First, a model of the surface and the inner portion, when a couple of electrodes 8 and 9 are pressed against a body to be tested and direct current is applied between the electrodes as shown in FIG. 2, i.e., a conventional method, is shown by a simple equivalent circuit in FIG. 4. Here, the circuit of the guard ring 11, which is provided for reducing the induction of error due to external noises, is omitted, and the internal resistance $r_0$ of the transmitting source S is neglected because it is generally extremely small.

An electric current which actually flows between the electrodes has a complicated cubic distribution which is dependent on potential difference between electrodes and conductivities of conductive paths. In order to make it easier to understand, the above-mentioned complicatedly distributed current is represented herein as two currents $I_s$ and $I_1$. To facilitate an understanding of the principles of the invention, it is convenient to analyze the circuit in terms of resistances in a direct current system rather than in terms of impedances in an alternating current system.

In FIG. 4, a general concept on the surface current and the inner current mentioned above will be explained.

Let it be considered that an output electric voltage from the transmitting source S is applied to a living body to be tested through the transmitting electrode 8 and the receiving electrode 9. Here, $r_o$ means an output resistance of the transmitting portion which is normally so small that it may be neglected.

It is impossible to divide resistance relating to the body 1 to be tested, which is shown by the cross section between the transmitting electrode 8 and the receiving electrode 9, and also an electric current which flows through this resistance, because it inherently has a continuous and cubic distribution which is very complicated.

The composite resistance $r_t$ between electrodes 8 and 9 is readily calculated as follows:

$$r_t = \frac{r_s(r_{d1} + r_{ds} + r_u)}{r_{d1} + r_{d2} + r_u + r_s}$$

wherein:
$r_s$ is the equivalent resistance in the vicinity of the surface portion of the body to be tested;
$r_{d1}$ and $R_{d2}$ are the resistances of the vertical portions of the inner portion of the body to be tested;
and $R_s$ is the resistance of the horizontal portion of the inner portion thereof.

It follows that the total electric current I which flow between the electrodes is as follows:

$$I = I_s + I_1 = \frac{e(r_{d1} + r_{d2} + r_u + r_s)}{r_s(r_{d1} + r_{d2} + r_u)}$$

wherein:
$I_s$ is the current which flows through the equivalent resistance $r_s$;
$I_1$ is the inner current which flows through resistances $r_{d1}$, $R_{d2}$ and $r_s$;
and e is the output voltage of the transmitting source S.

On the other hand, in the field of the physiological chemistry, it has been required the measure both the currents $I_s$ and $I_1$ separately in some applications. However, according to the conventional technique it was almost impossible. In other words, it was impossible to easily measure these currents until the electrode arrangement and measuring means in accordance with the present invention was introduced.

FIG. 3 shows the arrangement wherein an intermediate electrode 10 is disposed between the transmitting electrode 8 and the receiving electrode 9.

Figure 5:
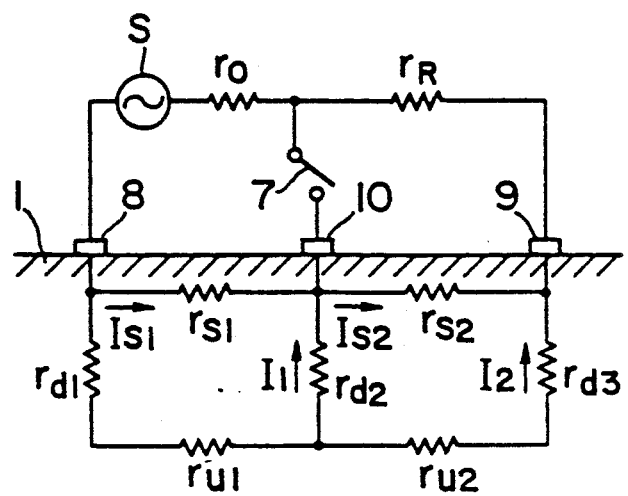

FIG. 5 shows the state wherein the electrodes are arranged to be in contact with the body to be tested. In this arrangement, the transmitting source 8 in the transmitting portion 2 and an input resistance $I_R$ in the receiving portion 5 are connected between the transmitting electrode 8 and the receiving electrode 9. Furthermore, a switch 7 and the intermediate electrode 10 are connected to the common ground point between the transmitting source S and the input resistance $r_R$.

In the case where the switch 7 remains open, thus eliminating the intermediate electrode 10 because no current flows through the resistor $r_{d2}$, the circuit performs similar to the circuit shown in FIG. 4. The composite resistance $r_t$ between the electrodes 8 and 9 is as follows:

$$r_t = \frac{(r_{s1} + r_{s2})(r_{d1} + r_{u1} + r_{u2} + r_{d3})}{r_{d1} + r_{u1} + r_{u2} + r_{d3} + r_{s1} + r_{s2}}$$

It then follows that the total electric current $I_t$ which flows between the electrodes 8 and 9 and is measured at the receiving means 5, is as follows:

$$I_t = I_{s1} + I_s = \frac{e(r_{d1} + r_{u1} + r_{u2} + r_{d3} + r_{s1} + r_{s2})}{(r_{s1} + r_{s2})(r_{d1} + r_{u2} + r_{u2} + r_{d3})}$$

wherein:
e is the output voltage of the transmitting source S; and
$I_{s1} = I_{s2}$ (Because the value of the input resistance $r_R$ can be neglected because it is generally set to be considerably lower than the resistance of the body 1 to be tested.)

Under this equation, and with this portion of the switch 7, the measurement cannot be made in the form by which $I_{s1}$ or $I_{s2}$ is separated from $I_2$. However, when the intermediate electrode 10 is provided and it is connected to the common ground point by switching on the switch 7, the surface current $I_{s1}$, which flows through the equivalent resistance $r_{s1}$ almost entirely flows into the intermediate electrode 10, therefore, the current $I_{s2}$ becomes almost zero.

On the contrary, since the vertical resistances $r_{d1}$, $r_{d2}$, and $r_{d3}$ are comparatively larger than the horizontal resistances $r_{u1}$ and $r_{u2}$ in the inner portion of the body 1 to be tested, the electric current which flows deeper into the body is divided into the electric current $I_1$, which flows into the intermediate electrode 10 through the resistance $r_{u1}$, and the other electric current $I_2$ which flows into the receiving electrode 9 through the resistance $r_{u2} = r_{d3}$. The value of $I_2$ is measured by the receiving device, when switch 7 is in the one position.

Therefore, it is possible to calculate the resistances and conductivities of the deep portion of a body to be tested by amplifying an electric voltage represented by $I_2 \times r_R$. Thus, the electric current, $I_t$ can be measured by switching off the switch 7 and the inner electric current $I_2$ can be measured by switching on the switch 7. Accordingly, the surface electric current $I_{s1}$ or $I_{s2}$ can be calculated by subtracting the electric current $I_2$ from the total electric current $I_t$. To perform such operation, the receiving portion 5 includes an amplifier for amplifying a measured current, a data-holder for holding the value of the inner current $I_2$, a subtractor for subtracting the current $I_2$ from the current $I_t$ to calculate the surface current $I_{s1}$ or $I_{s2}$, a processor for converting the measured value into a significant one, and as display for indicating such significant value. These electronic components are known and are commonly used in electrical current measuring devices.

In the embodiment shown, the electrodes are shown as circular and are coaxially arranged, but it is not necessary that these electrodes be circular shaped, provided that they are coaxially located. Furthermore, the coaxial arrangement of the electrodes is not necessary as long as they are arranged in the order described, such as in a linear arrangement.

Although the intermediate electrode is so organized as to be connected to the common ground point or as to be open by the switch in the embodiment, it will be understood that it could be organized so as to make switching between the common ground point and the receiving electrode.

In the equivalent circuit of the body 1 to be tested in the foregoing explanation, only resistance components have been illustrated. However, commercial frequency or high frequency is practically used as the transmitting source S.

Accordingly, it can be considered that, for example in the case of the skin of a living body, the body 1 to be tested consists of the surface which is a resistance having a different value according to perspiration state, and cell membranes of the subcutaneous tissue which are considered as an insulator having a large electrostatic capacity. Further, presuming that intercellular liquid wrapped by a cell membrane and extracellular liquid existing between cells are a kind of an electrolyte which has a low resistance, the equivalent circuit for this case can be considered by a model which is a series-parallel circuit of the resistance r and the electrostatic capacitance c.

Accordingly, for each of electrodes including an intermediate electrode according to the present invention, it is effective to provide means in which the frequency of the power supply frequency during the measurement of the conductivity of the inner portion of an body to be tested is set higher than that during the measurement of the conductivity of the surface.

Further, when the body to be tested has a curved surface or irregularity, each electrode may be constituted by a conductive soft material so that the electrode surface can contact the body to be tested in accordance with the shape of the surface of the body.

Further, adoption of the so-called cordless system wherein an FM transmitter and a power supply battery are loaded within a probe in which each electrode is disposed and unified, and the measured value by the probe is processed by wireless system including an FM receiver does not require a cable which connects the probe to a body of the measuring device, and therefore it has many advantages from the viewpoint of practical use.

According to the present invention, it is possible to detect the conductivities which differ at the surface layer and the deep portion separately, in a body to be tested, for example, the skin of a living body such as a human being and other animates, the bark of a plant, the surface portion of foods and so on.

Especially for a substance, such as subcutaneous cells of a living body, for which it is necessary to measure by non-destructive method, it becomes possible to measure conductivity or impedance of the surface layer and the inner tissue separately. Hence, the present invention can provide very effectively means for medical examination or foreseeing of the condition of a disease of the living body.

Furthermore, according to the present invention, it has become possible to perform a novel measurement by a very simple method. Moreover, the measuring system of the present invention can be very small in size and of low power consumption-type, and so it is possible to provide a low-priced portable device.

What is claimed is:

1. A conductivity measuring device for measuring the conductivity at the surface and at an inner portion of a body to be tested, comprising:

two measuring electrodes, including one transmitting electrode and one receiving electrode;

an intermediate electrode disposed between said measuring electrodes;

a circuit including a switch which connects the intermediate electrode to the receiving electrode, wherein the switch is changeable between two states, said switch in its first state connecting the intermediate electrode to a low-potential, so that current in the inner portion of the body between the transmitting electrode and the receiving electrode is measured, said switch in its second state being open to disconnect the intermediate electrode from the circuit so that a composite current in the body between the transmitting electrode and the receiving electrode in the body is measured.

2. A conductivity measuring device as set forth in claim 1, wherein said measuring electrodes for transmitting and receiving and said intermediate electrode are disposed concentrically or in a series to each other and these electrodes are unified into a probe.

3. A conductivity measuring device according to claim 1 wherein the measuring device includes a current meter and wherein the internal current of said body to be tested is measured by disposing the intermediate electrode between said measuring electrodes for transmitting and receiving, and subsequently the surface current is measured by making said intermediate electrode in open state by the switch, and the both measured values are operated thereby to exactly determine the conductivity of the surface of said body to be tested.

4. A conductivity measuring device according to claim 2, wherein an FM transmitter and a power supply battery are loaded in said probe so that the measured results can be determined by an FM receiver.

5. A conductivity measuring device according to claim 1, wherein the frequency of a power supply, when the conductivity of the inner portion of said body to be tested is measured, is set higher than that in a case when the conductivity of the surface is measured.

6. A conductivity measuring device according to claim 1, wherein each of said electrodes consists of a conductive soft material so as to contact the surface of said body to be tested in accordance with the shape of the surface of said body to be tested.

7. A conductivity measuring device according to claim 1, wherein the measurements are performed on a living body.

8. A method of measuring the conductivity at the surface and within a body to be tested comprising the following steps;

(a) providing a circuit including a transmitting electrode, a receiving electrode, and an intermediate electrode disposed along a common surface of said body;

(b) providing said intermediate electrode with a switch which electrically connects the intermediate electrode to the circuit and electrically disconnects the intermediate electrode from the circuit;

(c) measuring a composite current that includes (i) a surface current component and (ii) an inner current component in the body when the switch is in a position that disconnects the intermediate electrode from the circuit;

(d) storing a value representing said composite current in a memory;

(e) measuring said inner current component in the body when the switch is in a position that connects the intermediate electrode to the circuit;

(f) subtracting a value representing said inner current component from said value representing said composite current to obtain a value for the surface current component.

* * * * *